(12) United States Patent
Sakamoto et al.

(10) Patent No.: US 7,989,924 B2
(45) Date of Patent: Aug. 2, 2011

(54) SWITCHING ELEMENT, PROGRAMMABLE LOGIC INTEGRATED CIRCUIT AND MEMORY ELEMENT

(75) Inventors: Toshitsugu Sakamoto, Tokyo (JP); Noriyuki Iguchi, Tokyo (JP); Hiroshi Sunamura, Tokyo (JP)

(73) Assignee: NEC Corporation, Tokyo (JP)

( * ) Notice: Subject to any disclaimer, the term of this patent is extended or adjusted under 35 U.S.C. 154(b) by 307 days.

(21) Appl. No.: 11/430,844

(22) Filed: May 10, 2006

(65) Prior Publication Data
US 2006/0273429 A1 Dec. 7, 2006

(30) Foreign Application Priority Data
May 11, 2005 (JP) .................................. 2005-138213

(51) Int. Cl.
*H01L 29/12* (2006.01)
(52) U.S. Cl. .............................. 257/613; 257/E45.003
(58) Field of Classification Search ............... 257/613, 257/E45.003
See application file for complete search history.

(56) References Cited

U.S. PATENT DOCUMENTS

| 5,919,571 | A   | * | 7/1999  | Badding et al. ............ 428/432 |
| 7,307,270 | B2  | * | 12/2007 | Aratani et al. ............... 257/2 |
| 2002/0009877 | A1 | * | 1/2002  | Wang et al. ................. 438/637 |
| 2002/0020836 | A1 | * | 2/2002  | Kikuchi et al. ............... 257/1 |
| 2002/0168820 | A1 | * | 11/2002 | Kozicki et al. ............. 438/259 |
| 2005/0127524 | A1 | * | 6/2005  | Sakamoto et al. ......... 257/774 |

FOREIGN PATENT DOCUMENTS

WO    WO 03/094227 A1    11/2003
WO    WO 03094227    * 11/2003

* cited by examiner

*Primary Examiner* — Evan Pert
*Assistant Examiner* — Selim Ahmed
(74) *Attorney, Agent, or Firm* — McGinn IP Law Group, PLLC

(57) ABSTRACT

A switching element with a switching voltage set higher than conventional, which includes an ion conduction layer including tantalum oxide, a first electrode provided in contact with the ion conduction layer, and a second electrode provided in contact with the ion conduction layer and capable of supplying the ion conduction layer with metal ions.

20 Claims, 4 Drawing Sheets

|   | ION CONDUCTION LAYER | METAL ION | DIFFUSION COEFFICIENT($cm^2/s$) | SWITCHING VOLTAGE(V) |
|---|---|---|---|---|
| A | $Cu_2S$ | Cu | $10^{-6} - 10^{-8}$ | APPROX. 0.2 |
| B | AgI | Ag | NO DATA | APPROX. 0.1 |
| C | Ag2S | Ag | APPROX. $10^{-5}$ | APPROX. 0.15 |
| D | AgGeSe | Ag | NO DATA | APPROX. 0.2 |
| E | AgAsS | Ag | NO DATA | APPROX. 0.2 |
| F | $SiO_2$ | Cu | $< 10^{-22}$ | 1 ~ 4 |
| G | $Ta_2O_5$ | Cu | $< 10^{-22}$ | 1 ~ 4 |
| H | $Ta_2O_5$ | Ta | NO DATA | NOT SWITCHED |

SWITCHING ELEMENT, PROGRAMMABLE LOGIC INTEGRATED CIRCUIT AND MEMORY ELEMENT

BACKGROUND OF THE INVENTION

1. Field of the Invention

The present invention relates to a switching element using electrochemical reaction, a programmable logic integrated circuit and a memory element.

2. Description of the Related Art

Today, electronic apparatuses and the like use numbers of integrated circuits. Numbers of integrated circuits used in an electronic apparatus are so-called ASIC (Application Specific Integrated Circuit) which are dedicated circuits designed for the electronic apparatus. With such an application specific integrated circuit, since arrangement of a logic cell (a logic circuit as a unit of an AND circuit, an OR circuit and the like) and connection of logic cells are made in an integrated circuit manufacturing process, a circuit structure can not be modified after manufacturing.

In recent years, competition for developing electronic apparatuses has heated up and down-sizing of electronic apparatuses is accelerated. Under these circumstances, a programmable logic (programmable logic integrated circuit) draws attention which enables one chip to select a specific function from among many functions by changing a circuit structure by an electronic signal even after manufacturing. Programmable logic is structured to have a plurality of logic cells connected with each other by a switch. Representative examples of programmable logics include FPGA (Field-Programmable Gate Array) and DRP (Dynamically Reconfigurable Processor).

Although programmable logics thus attract attention, mounting programmable logics on electronic apparatuses and the like is limited so far. The reason is as follows. In programmable logics realized so far, the size of a switch connecting logic cells is large to have a large on-resistance. In order to limit the number of such switches disposed, logic cells having a large number of transistors are arranged in small number. As a result, flexibility in combining logic cells is reduced to limit a function which can be provided by a programmable logic. In other words, largeness in size of a switch used in a conventional programmable logic and its largeness in on-resistance limit the function of the programmable logic to limit mounting of the programmable logic on an electronic apparatus or the like.

In order to vary functions of a programmable logic to promote its mounting on an electronic apparatus or the like, it is necessary to reduce the size of a switch connecting logic cells with each other to decrease its on-resistance. Disclosed as a switch meeting such requirements is a switching element using metal ion migration within ion conductor (solid in which ions can move freely) and electrochemical reaction (see e.g. International Publication WO 2003/094227 A1 (Literature 1)). The switching element disclosed in the literature has a smaller size and a smaller on-resistance than those of a semiconductor switch (MOSFET etc.) which has been widely used in conventional programmable logics.

FIG. 8 is a sectional schematic diagram showing one example of a structure of the switching element disclosed in International Publication WO 2003/094227 A1 (Literature 1). The switching element is structured to have a first electrode 11 and a second electrode 12 provided on the first electrode 11 with an ion conductor layer 13 (represented as solid electrolyte in Literature 1) provided therebetween. The ion conductor layer 13 is a medium in which metal ions can transport.

Operation of the switch shown in FIG. 8 will be described. With the second electrode 12 grounded, when a negative voltage is applied to the first electrode 11, metal of the second electrode 12 is dissolved as metal ions into the ion conductor layer 13. Then, the metal ions in the ion conductor layer 13 are deposited as metal on the surface of the first electrode 12 and the deposited metal forms metal dendrite which connects the first electrode 11 and the second electrode 12. Metal dendrite is metal deposition as deposition of metal ions in the ion conductor layer 13. Electrically connecting the first electrode 11 and the second electrode 12 by metal dendrite causes the switch to turn on.

On the other hand, with the second electrode 12 in the on state grounded, when a positive voltage is applied to the first electrode 11, metal dendrite is dissolved into the ion conductor layer 13, so that a part of the metal dendrite is cut out. As a result, electrical connection between the first electrode 11 and the second electrode 12 is cut off to turn off the switch. From a stage preceding to a stage where the electrical connection is completely cut off, electrical characteristics are changed such as resistance between the first electrode 11 and the second electrode 12 is increased or interelectrode capacitance is changed to ultimately cut off electrical connection. As a material of the first electrode 11, preferable is one that fails to supply metal ions into the ion conductor layer at the application of a voltage. In addition, for changing from the above-described off state to the on state, another application of a negative voltage to the first electrode 11 is required.

Use of the switching element shown in FIG. 8 as a switch for switching programmable device interconnection is proposed (Journal of Solid State Circuits, vol. 40, No. 1, pp. 168-176, 2005 (Literature 2)). As compared with a conventional type, using this switching element not only reduces a switch area to 1/30 and switch resistance to 1/50 but also enables fabrication of a switching element into an interconnection layer. Therefore, reduction in a chip area and improvement in an interconnection delay can be expected. Furthermore, since a logic cell of a programmable logic can be reduced, efficiency of circuit use can be drastically improved to result in reducing the chip area to 1/10 to triple power efficiency. While a conventional type programmable logic has limited application due to its large chip size and low power efficiency, a new programmable logic using this switching element can cover a wide range of application.

Literature 1: International Publication WO 2003/094227 A1

Literature 2: Journal of Solid State Circuits, vol. 40, No. 1, pp. 168-176, 2005

The switching element disclosed in Literature 1 is realized by using Cu/Cu2S and Ag/Ag2S or the like for the combination of an electrode material and an ion conductor layer. In any of the combinations of materials, a switching voltage as a voltage to be applied to a first electrode for making transition of the switching element from the on state to the off state or from the off state to the on state is approximately from 0.05V to 0.3 V. On the other hand, as to a logic signal used as a signal in a programmable logic, in general, a voltage indicative of one information of two kinds of information is Vdd as an operating voltage of a logic circuit and a voltage indicative of the other information is 0V. Vdd used today in a silicon integrated circuit is approximately from 1 to 2 V.

Switching voltage is 0.3 V to the highest as described above and when Vdd of the logic signal is 1.0V, it will be lower than Vdd. Therefore, every time a logic signal with the voltage Vdd is applied to the switching element, 1.0 V voltage is applied to the first electrode, so that the state of the switch might be changed by the logic signal itself. In this case, the switching element might not function as a switch. It is necessary to more stabilize the switching element by increasing a switching voltage.

In addition, as a time period for maintaining the state of the switching element (time period for maintaining non-volatility), a period longer than a product life (10 years in general) of a programmable logic used is required. Since thermal energy in the vicinity of room temperature is 26 meV, as the switching voltage nears 26 mV, a probability of spontaneous state transition due to thermal noise will be increased. For elongating a maintaining time period, the switching voltage should be increased.

SUMMARY OF THE INVENTION

An object of the present invention, which intends to solve the above-described problems of conventional techniques, is to provide a switching element with a switching voltage set higher than conventional switching elements.

The switching element according to the present invention for achieving the above-described object is structured to have an ion conduction layer including tantalum oxide, a first electrode provided in contact with the ion conduction layer, and a second electrode provided in contact with the ion conduction layer and capable of supplying the ion conduction layer with metal ions.

According to the present invention, use of a material including tantalum oxide as an ion conduction layer obtains a higher switching voltage than that of a case where copper sulfide is used for an ion conduction layer and even when a voltage of a thermal noise level is applied, prevents the switching element from making transition from a set state to other state.

On the other hand, the switching element according to the present invention for achieving the above-described object is the above-described switching element according to the present invention used as a switch.

The memory element according to the present invention for achieving the above-described object is structured to have the above-described switching element of the present invention and a transistor element for reading whether the switching element is in an on state or an off state.

According to the present invention, use of an ion conduction layer including tantalum oxide makes a switching voltage be higher than a voltage of a thermal noise level to enable a set state to be maintained stably.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

A switching element according to the present invention is characterized in having an ion conduction layer including tantalum oxide.

Figures 1, 2:
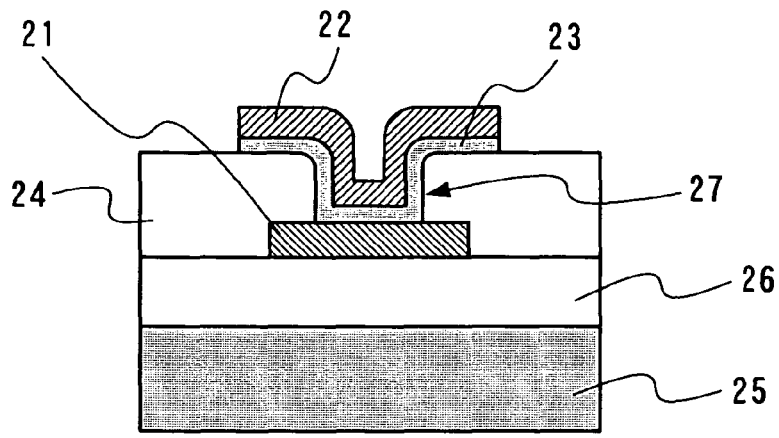
FIG. 1 is a sectional schematic diagram showing one example of a structure of a switching element according to the present embodiment.
FIG. 2 is a table indicative of a combination of materials of an electrode and an ion conduction layer.

Structure of a switching element according to the present embodiment will be described. FIG. 1 is a sectional schematic diagram showing one example of a structure of the switching element according to the present embodiment.

As illustrated in FIG. 1, the switching element is disposed on a silicon substrate 25 covered with a silicon oxide film 26 and includes a first electrode 21, an ion conduction layer 23 and a second electrode 22 disposed with the ion conduction layer 23 provided therebetween. The ion conduction layer 23 is formed of tantalum oxide with a film thickness of 15 nm, the first electrode 21 is formed of platinum with a film thickness of 100 nm and the second electrode 22 is formed of copper with a film thickness of 100 nm. A part of the first electrode 21 is covered with an insulation layer 24 of silicon oxide film and a part of the same is in contact with the ion conduction layer 23 through an opening 27 of the insulation layer 24.

In the structure according to the present embodiment, a switch part in which metal is actually deposited is formed in the opening 27 of the insulation layer 24. Thus, the switch part is formed. A junction surface between the first electrode 21 and the ion conduction layer 23 is set to have approximately the same area as that of a bottom surface of the opening 27. In other words, once a pattern of the opening 27 is determined, even if the pattern of the second electrode 22, the first electrode 21 and the ion conduction layer 23 is larger than the pattern of the opening 27, the area of the junction surface is determined by the bottom area of the opening 27. When forming a plurality of switching elements in the same substrate, forming the opening 27 for each element with high precision enables an element of uniform switching characteristics to be formed not only within the same substrate but also between different substrates. Accordingly, pattern formation of the second electrode 22, the first electrode 21 and the ion conduction layer 23 requires no such high precision as required for the pattern of the opening 27. In addition, since as shown in FIG. 1, other part between the second electrode 22 and the first electrode 21 than the switch part is isolated by the insulation layer 24, leakage current when the switching element is in the off state can be suppressed.

Next, the reason why a combination of copper and tantalum oxide is selected as materials of the second electrode 22 and the ion conduction layer 23 will be explained based on results of experiment.

Figure 8:
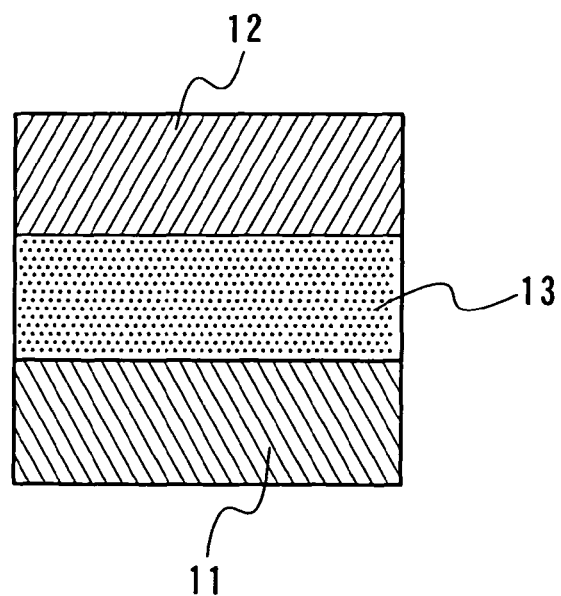
FIG. 8 is a sectional schematic diagram showing one example of a structure of a conventional switching element.

First, a phenomenon occurring at state transition will be described with respect to the conventional switching element shown in FIG. 8. When the switching element makes transition from the off state to the on state, three reactions occur simultaneously. The three reactions are (1) migration of metal ions (copper ions here) within the ion conduction layer 13, (2) deposition reaction of metal ions in the first electrode 11 and (3) metal dissolution reaction in the second electrode 12. The inventors intended to set a switching voltage, that is, a voltage required for the change from the off state to the on state, to be an arbitrary value by controlling a metal ion migration rate and an electrochemical reaction (deposition or dissolution) rate metal deposition speed and a metal dissolution speed.

FIG. 2 is a table showing a diffusion coefficient and a switching voltage for the combinations of the respective materials of the ion conduction layer and the metal ions. In this table, the combinations are classified by alphabets A to H. The diffusion coefficient and the ion conductivity are proportional and as the diffusion coefficient is increased, the ion conductivity becomes higher. The respective switching voltages excluding those of the combinations D and E are measured by the switching element shown in FIG. 8 which is manufactured by the inventors.

As shown in FIG. 2, in other combinations than F and G which use oxide for an ion conductor layer, the switching voltage is on the order of 0.2 V which is far lower than 1V as a logic voltage. In the following, results of the respective combinations will de detailed.

In the combinations A to E, used as the ion conduction layer is a material combining chalcogen elements (S, Se, Ge, Te) and metallic element (Ag, Cu). These compounds are hologenide, a kind of chalcogenide. Ion conductivities of many of silver halide and copper halide ($Cu_2S$, $Ag_2S$, $AgI$, etc.) are high and these materials are in some cases called superionic conductor. High ion conductivity as a conspicuous feature of such a material as a superionic conductor is due to structural defects derived from crystal structure itself of these compounds. Vacancy as a missing part of a metallic element or a chalcogen element structurally exists in great numbers within crystal to serve as a site in which metal ions can transport.

On the other hand, used as the ion conduction layer of the combinations F to H is an oxide. Ion conduction in the oxide is classified into a type of halogenide in which metal ions can transport through vacancy and a type in which the same can transport through interstitial region. Vacancy can be formed by introducing impurity ions, for example. Ion conductor of a type in which metal ions transport through interstitial region has a very low ion conductivity.

The inventors noted silicon oxide ($SiO_2$) and tantalum oxide ($Ta_2O_5$) as an oxide for use in the ion conduction layer. These oxides, which are used for conventional LSI (Large Scale Integrated Circuit) materials, have large process endurance and high reliability and have an advantage of enabling the switch of the present invention to be introduced into the LSI with ease.

According to the combinations F and G in the table shown in FIG. 2, in a case where copper ions are used as metal ions, the switching voltage is not less than 1V to achieve a desired switching voltage. When tantalum ions are used as a conduction specie, no switching has been observed. Furthermore, since when the switching elements are manufactured by the combination F, a part of the switching elements have the insulation destruction phenomenon observed, the combination G is found to be the best. Therefore, in the present embodiment, tantalum oxide is used for the ion conduction layer 23 and copper is used for the second electrode 22 as shown in FIG. 1.

Here, although no experiment related to a combination between silver and tantalum oxide is made, since silver ions have a diffusion coefficient approximately equivalent to that of copper ions in tantalum oxide, the same effects can be expected from silver. From any combination between metal ions having a similar diffusion coefficient in tantalum oxide to that of copper ions and the ion conduction layer, the same switching voltage as that by the combination G is expected. Furthermore, because the switching voltage is determined by diffusion of copper ions in tantalum oxide, it is considered that also in a case where a part of the ion conduction layer includes tantalum oxide, the same switching voltage as the result of the combination G is obtained.

Next, description will be made of a method of manufacturing the switching element shown in FIG. 1.

On the surface of the silicon substrate 25, form the silicon oxide film 26 with a film thickness of 300 nm. Subsequently, form the first electrode 21 made of platinum by the following manner by the lift-off technique similarly to a conventional method. Spin-coat a photo resist on the silicon oxide film 26 to pattern the photo resist to have a part in which the first electrode 21 is to be formed by the lithography technique. Then, after forming platinum with a film thickness of 100 nm by the vacuum evaporation method, make a part left by lifting off the platinum on the resist when removing the photo resist be the first electrode 21.

Subsequently, using HSQ (hydrogen silsesquioxane) with silicon oxide as a main component, form the insulation layer 24 by the following manner. Spin-coat the HSQ with a film thickness of 100 nm to pattern the opening 27 on the first electrode 21 by the electron beam exposure method. Expose a part of the first electrode 21 at the opening 27. Since HSQ enables patterning by electron beam exposure, it is only necessary to execute a process of forming a pattern on the resist (here, HSQ) and no process of transfer-printing the pattern of the resist onto a lower film is required. Since the HSQ patterning technique is disclosed, for example, in Journal of Vacuum Science Technology B, vol. 16, No. 1, pp. 69-76 (1998), detailed description thereof will be omitted.

HSQ is known as an insulation film having a low dielectric constant (the dielectric constant is on the order from 2 to 3) and is used as an interlayer insulation film of an LSI. The reason why a low dielectric constant is desirable as an LSI material is that an interconnection delay can be reduced by decreasing electrostatic coupling between interconnection layers. In the structure of the present embodiment, electrostatic coupling between the first electrode 21 and the second electrode 22 can be reduced to enable a signal delay in each electrode to be suppressed.

Subsequently, form the second electrode 22 made of copper and the ion conduction layer 23 made of tantalum oxide by the following manner. Spin-coat a photo resist on the insulation layer 24 to pattern the photo resist by the lithography. By the patterning, not only expose the opening 27 in the resist but also form a larger opening than the pattern of the opening 27. After cleaning, by using oxygen plasma, the surface of the first electrode 21 exposed after the patterning, and removing organic matters such as resist residues, deposit a tantalum oxide with a film thickness of 15 nm by laser abrasion. At this time, form the tantalum oxide to be as approximate to stoichiometric ditantalum pentoxide as possible. More specifically, supply sufficient oxygen at the time of laser abrasion.

Description will be here made of a result of experiment executed for obtaining tantalum oxide formation conditions. The inventors have formed a tantalum oxide under respective conditions of 0 Pa, 0.2 Pa, 1 Pa and 2 Pa as oxygen partial pressures.

Figure 3:
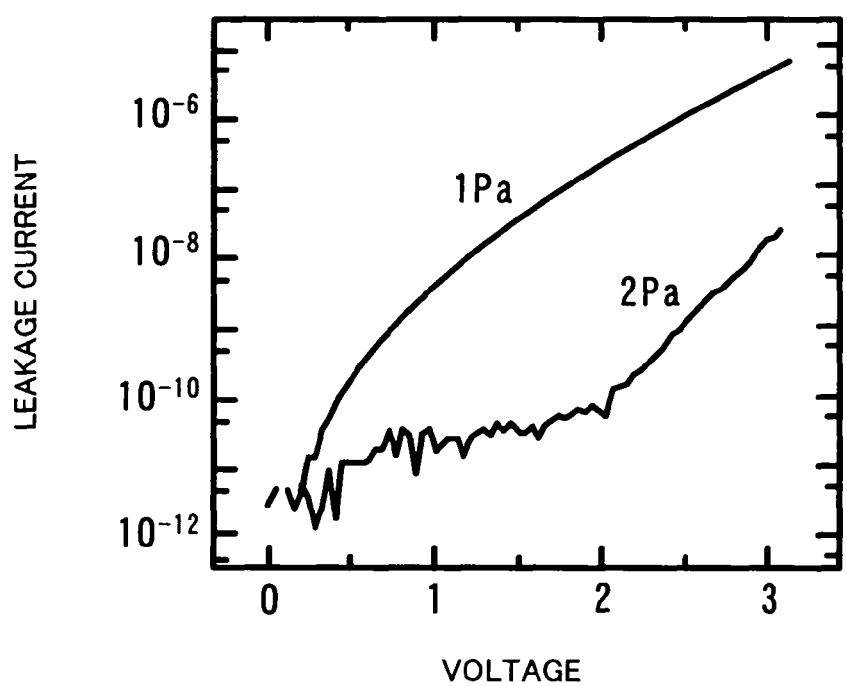
FIG. 3 is a graph showing leakage current characteristics of tantalum oxide.

FIG. 3 is a graph showing leakage current of a tantalum oxide formed under the conditions of the oxygen partial pressures 1 Pa and 2 Pa. As shown in the graph of FIG. 3, although tantalum oxide is an insulator, with respect to the tantalum oxide at an oxygen partial pressure of 1 Pa, a leakage current on the order of 1 µA is observed at 2.5 V. A large leakage current of 1 µA is thought to be generated due to oxygen defects caused by a low oxygen partial pressure. On the other hand, as to the tantalum oxide formed under the condition of the oxygen partial pressure of 2 Pa, a leakage current is suppressed to approximately 1 nA. Leakage current on the order of nanoampere (nA) is derived from tunnel effects, which indicates that the formed tantalum oxide functions as an insulation film. Then, under the oxygen partial pressure of 2 Pa, 2.5 is obtained as a composition ratio of oxygen to tantalum. It shows that under this formation condition, a ditantalum pentoxide is obtained. In component analysis, however, the composition ratio includes an error of ±0.1. As described in the foregoing, for suppressing leakage current when the switching element is off, a ditantalum pentoxide is suitable as a stoichiometric composition of a tantalum oxide.

After depositing the tantalum oxide under thus obtained formation condition, deposit copper to the film thickness of 100 nm by vacuum evaporation. Thereafter, when removing the photo resist, by removing the tantalum oxide and the copper on the photo resist as well by lift-off, form the second electrode 22 and the ion conduction layer 23.

The above-described laser abrasion and vacuum evaporation are preferably executed in the same vacuum chamber. Preventing the surfaces of the tantalum oxide and the copper from being exposed to air enables clear surfaces to be formed. After forming the tantalum oxide, forming copper without exposing the surface of the tantalum oxide obtains the effect of improving a yield of the switching elements. This is considered to be derived from the fact that attachment of such dusts as metal ions and organic matters contained in the air onto the tantalum oxide is prevented to suppress generation of defective insulation due to dusts.

While not described in the present embodiment, use of barrier metal for preventing an electrode material from diffusing into an insulation layer is knowledge of one those skilled in the art and when incorporating the switching element shown in FIG. 1 into an integrated circuit, barrier metals are required between each of the first electrode 21 and the second electrode 22, and the insulation layer 24.

Furthermore, while in the present embodiment, platinum is used as the first electrode 21, the first electrode 21 is not limited to platinum and can be made of any electrode material that does not cause the ion conduction layer to dissolve metal ions. For example, tungsten, tantalum and titanium may be used.

Next, operation of the switching element shown in FIG. 1 will be described.

Figure 4:
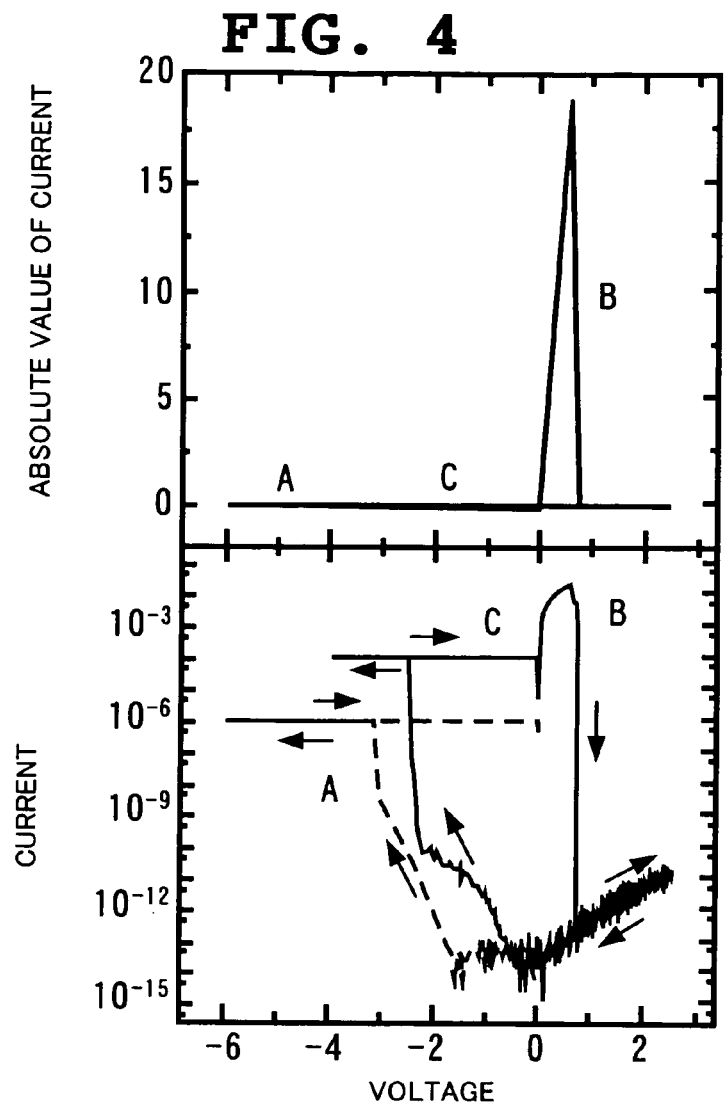
FIG. 4 is a graph showing switching characteristics of the switching element according to the present embodiment.

FIG. 4 is a graph showing switching characteristics. An absolute value of current is limited to 1 µA by a measurement instrument. As shown in FIG. 4, when a negative voltage is applied to the first electrode 21 to increase the voltage to the minus side from the voltage 0V, a current value reaches the limit value 1 µA in the vicinity of −3V (a broken line A indicated in FIG. 4), so that the switching element makes transition from an off state (a state of large resistance) to an on state (a state of small resistance). In the initial state, the switching element is in the off state and on the broken line A indicated in FIG. 4 after making transition to the on state, a resistance value of the switching element is 30Ω. Then, when upon returning the applied voltage to the first electrode 21 to 0V, the current limit of the measurement instrument is released and a positive voltage is subsequently applied to gradually increase the voltage, not less than 17 mA of current flows in the vicinity of 0.3V. When further increasing the voltage, the current drastically decreases at 0.6V to make transition to the off state (a solid line B indicated in FIG. 4). Thereafter, even when increasing the voltage to about 2V, the current flows up to about 10-11 A, so that the switching element maintains the off state.

Next, upon returning the voltage applied to the first electrode 21 to 0V, limit the current absolute value to 100 µA. Then, when a negative voltage is applied to the first electrode 21 to increase the voltage to the minus side from the voltage of 0V, the current value reaches the limit value 100 µA in the vicinity of −2.5V, so that the switching element makes transition to the on state (a solid line C indicated in FIG. 4).

Hereafter, thus applying a positive or negative voltage to the first electrode 21 enables the switching element to alternately make transition between the on state and the off state. In addition, after bringing the switching element into either the on state or the off state, even voltage application is stopped, the switching element can maintain its state.

Figure 5:
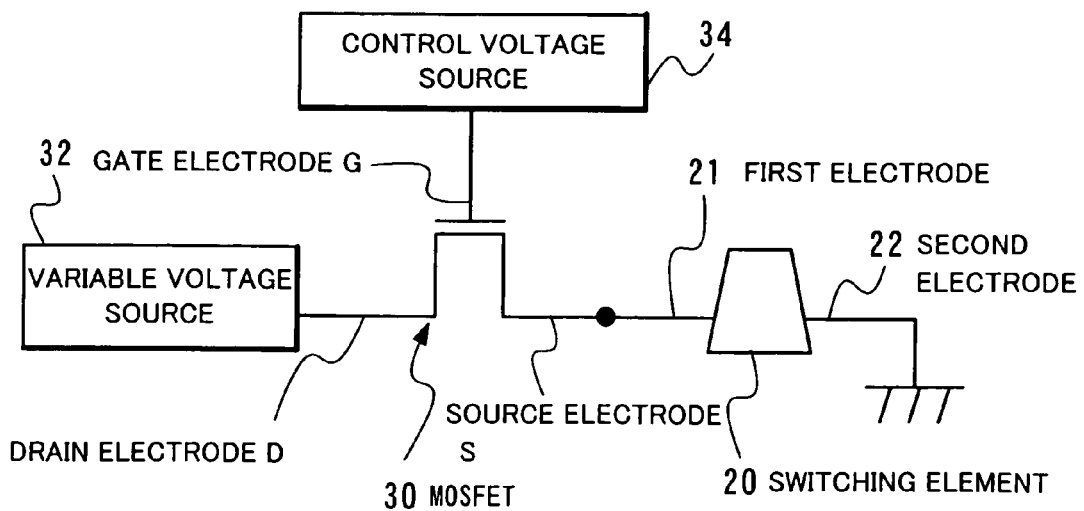
FIG. 5 is a diagram showing one example of a structure of a circuit for controlling current of the switching element according to the present embodiment.

While current flowing in the switching element is controlled by the measurement instrument here, one example of a method of limiting a current when the switch element is implemented in integrated circuits such as a programmable logic and a memory will be described in the following. FIG. 5 is a diagram showing one example of a structure of a circuit for limiting current. As shown in FIG. 5, to a switching element 20, a MOSFET 30 is connected. To a drain electrode D of the MOSFET 30, a variable voltage source 32 is connected and to a gate electrode G, a control voltage source 34 is connected. The first electrode 21 of the switching element 20 is connected to a source electrode S of the MOSFET 30 and the second electrode 22 is connected to a ground potential. Since in a saturation region of Id (drain current)−Vd (drain voltage) characteristic of the MOSFET 30, even when the drain voltage to be applied to the drain electrode D is changed, the drain current can be maintained substantially constant, so that the maximum current flowing into the first electrode 21 can be limited. The amount of the drain current can be controlled by a gate voltage to be applied to the gate electrode G. The reason why the current flowing through the switching element 20 is limited is that destruction of the switching element 20 caused by Joule heating is prevented.

Next, the phenomena of the switching characteristics shown in FIG. 4 will be described. When a negative voltage is applied to the first electrode 21, copper in the second electrode 22 dissolves as copper ions into the ion conduction layer 23. Then, the copper ions dissolved in the ion conduction layer 23 are deposited as copper on the surface of the first electrode 21, so that the electric conductivity in the ion conduction layer 23 is increased. Then, the deposited copper forms metal dendrite which connects the first electrode 21 and the second electrode 22. Electrically connecting the first electrode 21 and the second electrode 22 by metal dendrite turns on the switching element.

On the other hand, when applying a positive voltage to the first electrode 21 in the above-described on state, the copper in the metal dendrite dissolves into the ion conduction layer 23, so that a part of the metal dendrite is cut off. As a result, the electrical connection between the first electrode 21 and the second electrode 22 is cut off to turn off the switching element. When the deposited copper starts dissolving into the ion conduction layer 23, the electric conductivity in the ion conduction layer 23 is decreased. Therefore, from a stage preceding to a stage where the electrical connection is cut off completely, electrical characteristics are changed such as an increase in resistance between the first electrode 21 and the second electrode 22 or change of interelectrode capacitance. Thereafter, the electrical connection is completely cut off at last.

As shown in FIG. 4, at the first negative voltage application (the broken line A in FIG. 4) and the second negative voltage application (the solid line C in FIG. 4), a transitional voltage (i.e. switching voltage) varies. The reason is thought to be that copper ions diffuse into the ion conduction layer by the first negative voltage application and even when returning the applied voltage to 0V, the diffused copper ions remain in the ion conduction layer. Because the switching voltage at the first negative voltage application is high, a limit value of current flowing through the switching element should be set to be small taking Joule heating generated at first transition from the off state to the on state into consideration.

In the switching element according to the present embodiment, the switching voltage required for making transition between the on state and the off state is on the order of 2V, which is higher because of use of tantalum oxide as an oxide than the switching voltage in a case where copper sulfide is used in the ion conduction layer. The switching voltage thus set to a higher value than a voltage at a thermal noise level input to the electrode of the switching element prevents the switching element from making transition from the set state to other state.

In addition, limiting current flowing between the electrodes in the on state not only prevents destruction of the switching element but also enables power to be suppressed.

Next, a programmable logic using the switching element of the present embodiment will be described.

Figure 6:
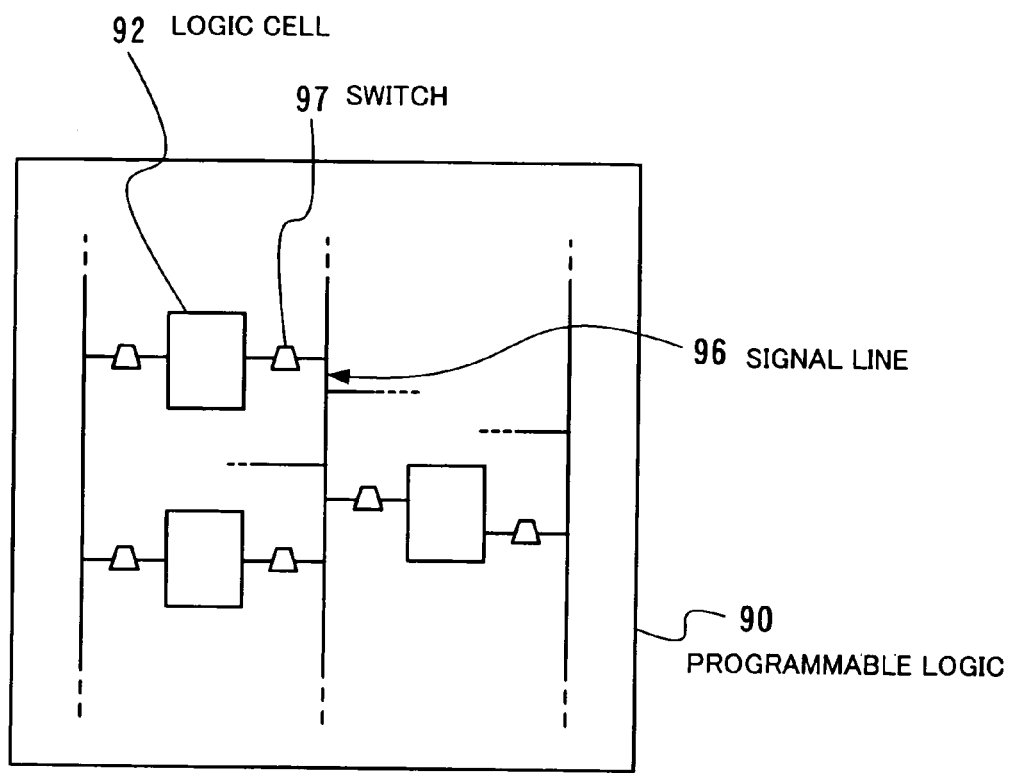
FIG. 6 is a schematic diagram showing an example of a structure of a programmable logic using the switching element according to the present embodiment.

FIG. 6 is a schematic diagram showing one example of a structure of a programmable logic.

As shown in FIG. 6, a programmable logic 90 is formed of numbers of logic cells 92 arranged in a two-dimensional array, interconnections for connecting the logic cells and numbers of switches 97 for switching connection/non-connection between the interconnections. By changing a connection state (connection/non-connection) of the switch, a structure of the interconnections between the logic cells, functions of the logic cells and the like can be set to obtain a logic integrated circuit meeting the specification. As the switch 97, the switching element shown in FIG. 1 is used. Although illustration of arrangement for limiting current and description thereof will be omitted, the MOSFET 30 shown in FIG. 5 may be provided in each switch 97.

The first electrode 21 of the switch 97 is connected to a signal line 96 in the programmable logic 90 and the second electrode 22 is connected to the logic cell 92. When the switch 97 is set in the on state by user's operation, a state where the first electrode 21 and the second electrode 22 are electrically connected is maintained. Then, when the logic signal reaches the first electrode 21 through the signal line 96, it is applied to the logic cell 92 through the second electrode 22. On the other hand, when the switch 97 is set to be in the off state, the state where the electrical connection between the first electrode 21 and the second electrode 22 is cut off is maintained. In this case, even when the logic signal reaches the first electrode 21 through the signal line 96, it can not enter the logic cell 92 connected to the second electrode 22.

Thus, in the programmable logic, the switch set in the on state by a user functions as a signal line and a logic cell connected to the switch in the on state maintains its operable state.

Using the switching element of the present embodiment as a switch of a programmable logic enables the switching voltage to be set to a higher value than that of a logic signal to prevent the switch from making transition from the set state to other state.

While the switching element of the present embodiment is used for switching connection/non-connection to the logic cell, it is also applicable to a switch for switching interconnection or switching the function of the logic cell. With a circuit structure changed by an electronic signal, the switching element is applicable also to FPGA and DRP capable of providing numbers of functions by one chip.

Next, a memory element using the switching element of the present embodiment will be described.

Figure 7:
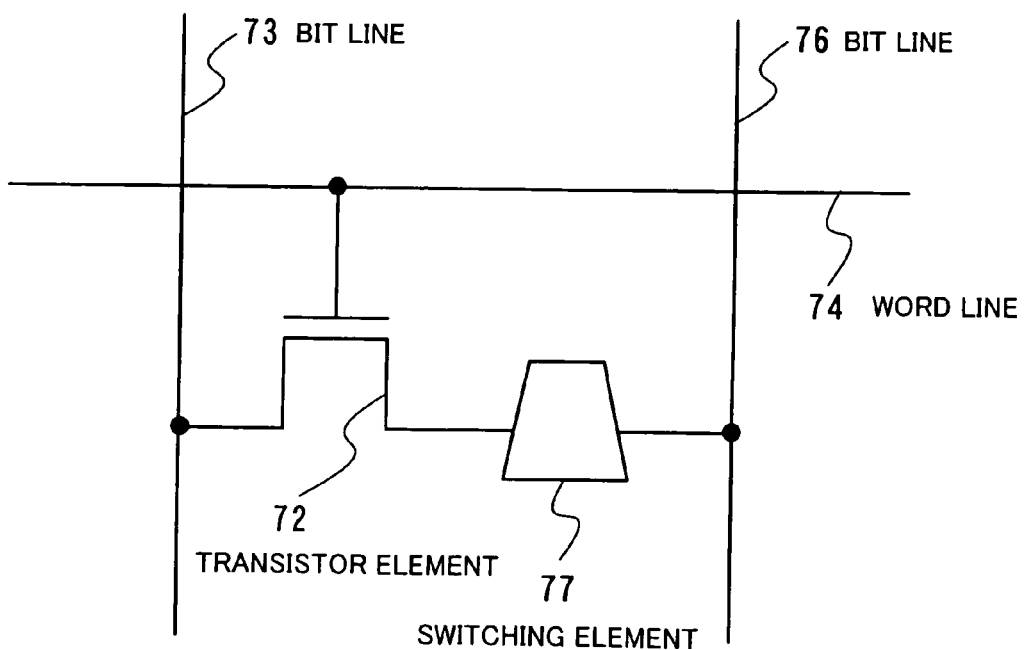
FIG. 7 is a schematic diagram of a circuit showing one example of a structure of a memory element using the switching element according to the present embodiment.

FIG. 7 is a schematic diagram showing one example of a structure of a memory element.

As shown in FIG. 7, the memory element includes a switching element 77 for holding information and a transistor element 72 for reading information of the switching element 77. As the switching element 77, the switching element shown in FIG. 1 is used.

The transistor element 72 has a source electrode connected to a bit line 73 and a gate electrode connected to a word line 74. The switching element 77 has its first electrode 21 connected to a drain electrode of the transistor 72 and its second electrode 22 connected to a bit line 76. The bit line 76 is connected to a ground potential.

Next, description will be made of a method of writing information to a memory element. Of the information to be held as "1" and "0", assume the on state of the switching element to be "1" and the off state to be "0". Also assume the switching voltage of the switching element to be Vt and the operating voltage of the transistor element 72 to be VR. Here, assume an absolute value of the switching voltage to be 2.5V.

For writing the information "1" to the memory element, apply the switching voltage of −Vt to the bit line 73 and apply the voltage VR to the word line 74 to turn on the transistor element 72. As a result, the switching voltage of −Vt is applied to the first electrode 21 of the switching element 77 to turn on the switching element 77, so that the information "1" is written.

For writing the information "0" to the memory element, apply the switching voltage of +Vt to the bit line 73 and apply the voltage VR to the word line 74 to turn on the transistor element 72. As a result, the switching voltage of +Vt is applied to the first electrode 21 of the switching element 77 to turn off the switching element 77, so that the information "0" is written.

Next, description will be made of a method of reading information held in the memory element.

Apply the voltage VR to the word line 74 to turn on the transistor element 72 and obtain a value of resistance between the bit line 73 and the bit line 76. The resistance value makes a combined resistance value of an on-resistance of the transistor element 72 and the switching element 77. When the combined resistance value is too large to be measured, determination can be made that the switching element 77 is in the off state to find that the information held in the memory element is "0". On the other hand, when the combined resistance value is smaller than a predetermined value, determination can be made that the switching element 77 is in the on state to find that the information held in the memory element is "1".

Although description of a method of limiting current flowing in the switching element is omitted here, the transistor 72 may execute control for limiting current other than the above-described operation.

Because of use of the switching element of the present embodiment as a storage element for holding information of a memory element, even when a voltage of a thermal noise level is applied, the switching element remains in the set state to hold stored information. In addition, since the memory element according to present embodiment has its switching element state maintained even when no power is supplied, it functions as a nonvolatile storage element. Furthermore, because the switching voltage is higher than a voltage of a thermal noise level, a time period for holding a nonvolatile storage element is expected to exceed 10 years.

Although in the switching element of the present embodiment, the ion conduction layer is formed only of tantalum oxide, the layer may be formed of other film accumulated on the film of tantalum oxide. Also in this case, the effect of higher switching voltage than a conventional voltage can be obtained.

Thus, use of an ion conduction layer including tantalum oxide enables the present invention to have a switching voltage higher than a voltage of a thermal noise level to maintain a set state stably.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A switching element, comprising:
an ion conduction layer including tantalum oxide;
a first electrode provided in contact with said ion conduction layer;
a second electrode provided in contact with said ion conduction layer and capable of supplying said ion conduction layer with metal ions; and
an insulation layer provided between the first electrode and the ion conduction layer,
wherein the insulation layer, has openings defined therein through which the ion conduction layer contacts the first electrode, and
wherein said second electrode comprises copper and said first electrode comprises one of platinum, tungsten, tantalum, and titanium as a material which does not supply said ion conduction layer with metal ions at an application of a positive voltage.

2. The switching element as set forth in claim 1, wherein a deposition of said metal ions as a metal in the ion conduction layer increases an electric conductivity between said first electrode and said second electrode and a dissolution of the deposited metal into the ion conduction layer decreases the electric conductivity.

3. The switching element as set forth in claim 2, wherein the deposition and dissolution of said metal is realized by an application of a voltage between said first electrode and said second electrode or by flowing a current between said first electrode and said second electrode.

4. The switching element as set forth in claim 1, wherein said tantalum oxide comprises a stoichiometric composition of ditantalum pentoxide.

5. The switching element as set forth in claim 3, wherein, at a time of depositing said metal by applying the voltage between said first electrode and said second electrode, power is suppressed by limiting current flowing between said first electrode and said second electrode.

6. A programmable logic integrated circuit using a switching element as a switch, wherein said switching element includes:
an ion conduction layer including tantalum oxide;
a first electrode provided in contact with said ion conduction layer;
a second electrode provided in contact with said ion conduction layer and capable of supplying said ion conduction layer with metal ions; and
an insulation layer provided between the first electrode and the ion conduction layer,
wherein the insulation layer has openings defined therein through which the ion conduction layer contacts the first electrode, and
wherein said second electrode comprises copper and said first electrode comprises one of platinum, tungsten, tantalum, and titanium as a material which does not supply said ion conduction layer with metal ions at an application of a positive voltage.

7. The logic integrated circuit as set forth in claim 6, wherein, in said switching element, a deposition of said metal ions as a metal in the ion conduction layer increases an electric conductivity between said first electrode and said second electrode and a dissolution of the deposited metal into the ion conduction layer decreases the electric conductivity.

8. The logic integrated circuit as set forth in claim 7, wherein the deposition and dissolution of said metal is realized by an application of a voltage between said first electrode and said second electrode of said switching element or by flowing a current between said first electrode and said second electrode.

9. The logic integrated circuit as set forth in claim 6, wherein said tantalum oxide of said switching element comprises a stoichiometric composition of ditantalum pentoxide.

10. The logic integrated circuit as set forth in claim 8, wherein, at a time of depositing said metal by applying the voltage between said first electrode and said second electrode of said switching element, power is suppressed by a limiting current flowing between said first electrode and said second electrode.

11. A memory element, comprising:
switching element including an ion conduction layer including tantalum oxide,
a first electrode provided in contact with said ion conduction layer;
a second electrode provided in contact with said ion conduction layer and, capable of supplying said ion conduction layer with metal ions;
a transistor element for reading whether said switching element is in an ON state or an OFF state; and
an insulation layer provided between the first electrode and the ion conduction layer,
wherein the insulation layer has openings defined therein through which the ion conduction layer contacts the first electrode, and
wherein said second electrode comprises copper and said first electrode comprises one of platinum, tungsten, tantalum and titanium as a material which does not supply said ion conduction layer with metal ions at an application of a positive voltage.

12. The memory element as set forth in claim 11, wherein in, said switching element, a deposition of said metal ions as a metal in the ion conduction layer increases an electric conductivity between said first electrode and said second electrode and a dissolution of the deposited metal into the ion conduction layer decreases the electric conductivity.

13. The memory element as set forth in claim 12, wherein the deposition and dissolution of said metal is realized by an application of a voltage between said first electrode and said second electrode of said switching element or flowing current between said first electrode and said second electrode.

14. The memory element as set forth in claim 11, wherein said tantalum oxide of said switching element comprises a stoichiometric composition of ditantalum pentoxide.

15. The memory element as set forth in claim 13, wherein, at a time of depositing said metal by applying the voltage between said first electrode and second electrode of said switching element, power is suppressed by limiting current flowing between said first electrode and said second electrode.

16. The switching element as set forth in claim 1, wherein said ion conduction layer comprises a vertical portion extending from a contact area with said first electrode.

17. The switching element as set forth in claim 16, wherein said ion conduction layer further comprises a first horizontal portion at said contact area with said first electrode and a second horizontal portion extending from a distal portion of said vertical portion.

18. The switching element as set forth in claim 16, wherein said ion conduction layer further comprises a first horizontal portion between said first electrode and said second electrode and a second horizontal portion provided between said second electrode and said insulation layer.

19. The switching element as set forth in claim 1, further comprising an oxide film disposed on a bottom surface of the first electrode.

20. The switching element as set forth in claim 19, wherein a bottom surface of the insulation layer contacts the oxide film.

* * * * *